United States Patent
Stone et al.

(10) Patent No.: US 9,442,539 B2
(45) Date of Patent: Sep. 13, 2016

(54) REDUCED LENGTH MEMORY CARD

(71) Applicant: PNY Technologies, Inc., Parsippany, NJ (US)

(72) Inventors: Robert Stone, Easton, PA (US); Joseph Pluchino, Budd Lake, NJ (US)

(73) Assignee: PNY Technologies, Inc., Parsippany, NJ (US)

( * ) Notice: Subject to any disclaimer, the term of this patent is extended or adjusted under 35 U.S.C. 154(b) by 59 days.

(21) Appl. No.: 14/245,343

(22) Filed: Apr. 4, 2014

(65) Prior Publication Data
US 2014/0301032 A1    Oct. 9, 2014

Related U.S. Application Data

(60) Provisional application No. 61/809,033, filed on Apr. 5, 2013.

(51) Int. Cl.
*G06F 1/18* (2006.01)
*H05K 3/36* (2006.01)

(52) U.S. Cl.
CPC ............ *G06F 1/185* (2013.01); *H05K 3/368* (2013.01); *H05K 2201/0999* (2013.01); *H05K 2201/09754* (2013.01)

(58) Field of Classification Search
CPC ................... G06F 1/185; H05K 2201/09754; H05K 2201/0999; H05K 3/368
USPC .................................................. 361/679.32
See application file for complete search history.

(56) References Cited

U.S. PATENT DOCUMENTS

| | | | |
|---|---|---|---|
| 5,467,871 A * | 11/1995 | DeField | G09F 23/00 206/232 |
| D364,861 S | 12/1995 | Luong | |
| 6,112,996 A * | 9/2000 | Matsuo | G06K 7/00 235/486 |
| D445,797 S | 7/2001 | Lee et al. | |
| 6,381,143 B1 * | 4/2002 | Nakamura | B29C 65/08 235/492 |
| D467,586 S | 12/2002 | Shimoda et al. | |
| D474,774 S | 5/2003 | Taniguchi et al. | |
| D475,056 S | 5/2003 | Taniguchi et al. | |

(Continued)

OTHER PUBLICATIONS

International Search Report of the International Searching Authority mailed on Aug. 25, 2014, issued in connection with International Application No. PCT/US2014/032981 (3 pages).

(Continued)

*Primary Examiner* — Courtney Smith
*Assistant Examiner* — Michael Matey
(74) *Attorney, Agent, or Firm* — McCarter & English, LLP

(57) ABSTRACT

A reduced length memory card is provided. The memory card, comprising a memory circuit, a housing for said memory circuit, said housing defining a first end, a second end opposite the first end and insertable into a port of a digital device, and opposing sidewalls between the first end and the second end, and a plurality of electrical contacts in electrical communication with said memory circuit, said contacts exposed through apertures formed in a bottom surface of the housing extending between the first end and the second end, wherein the memory card is electrically compatible with a Secure Digital (SD) standard, and wherein a length of the card extending between the first end and the second end is less than a width of the card extending between the opposing sidewalls. The memory could comprise an extraction ridge along the first end of the card and exposed when the card is inserted into the port of the digital device.

10 Claims, 5 Drawing Sheets

(56) References Cited

U.S. PATENT DOCUMENTS

| | | | |
|---|---|---|---|
| D475,713 S | 6/2003 | Taniguchi et al. | |
| D476,012 S | 6/2003 | Taniguchi et al. | |
| 6,594,154 B1 * | 7/2003 | Brewer | A44B 15/005 235/492 |
| D479,845 S | 9/2003 | Taniguchi et al. | |
| 6,628,524 B1 | 9/2003 | Washino et al. | |
| 6,636,773 B1 | 10/2003 | Tagawa et al. | |
| D487,747 S | 3/2004 | Yu et al. | |
| D492,687 S | 7/2004 | Yu et al. | |
| D493,798 S | 8/2004 | Yu et al. | |
| D494,180 S | 8/2004 | Taniguchi | |
| 6,784,527 B2 | 8/2004 | Fukunaga | |
| 6,816,386 B2 | 11/2004 | Oguchi et al. | |
| 6,848,577 B2 * | 2/2005 | Kawamura | A24F 15/12 206/37 |
| 6,858,925 B2 | 2/2005 | Wada et al. | |
| D504,433 S | 4/2005 | Nishizawa et al. | |
| 6,979,227 B2 | 12/2005 | Ikeda | |
| 7,009,846 B1 | 3/2006 | Wang et al. | |
| 7,059,871 B1 | 6/2006 | Hsiao | |
| D525,623 S | 7/2006 | Takiar et al. | |
| D529,031 S | 9/2006 | Huang et al. | |
| D530,331 S | 10/2006 | Yao | |
| D533,556 S | 12/2006 | Yamada et al. | |
| D537,824 S | 3/2007 | Day et al. | |
| D542,797 S | 5/2007 | Cuellar et al. | |
| 7,239,011 B2 | 7/2007 | Wada et al. | |
| D552,099 S | 10/2007 | Nishizawa et al. | |
| D552,612 S | 10/2007 | Nishizawa et al. | |
| D554,123 S | 10/2007 | Day et al. | |
| 7,307,848 B2 * | 12/2007 | Takiar | G06K 19/077 361/736 |
| 7,336,498 B2 | 2/2008 | Takiar et al. | |
| 7,410,376 B2 | 8/2008 | Ying et al. | |
| 7,433,196 B1 | 10/2008 | Wang et al. | |
| D581,932 S | 12/2008 | Nishizawa et al. | |
| D585,068 S | 1/2009 | Elliott et al. | |
| D588,598 S | 3/2009 | Nakamura | |
| 7,629,679 B2 | 12/2009 | Park | |
| 7,795,714 B2 | 9/2010 | Hiew et al. | |
| 7,804,163 B2 | 9/2010 | Hiew et al. | |
| 7,813,137 B2 | 10/2010 | Gu et al. | |
| 7,855,099 B2 | 12/2010 | Ni et al. | |
| D641,050 S | 7/2011 | Matsui et al. | |
| 8,060,131 B2 | 11/2011 | Shin et al. | |
| 8,097,939 B2 | 1/2012 | Okada | |
| 8,102,658 B2 | 1/2012 | Hiew et al. | |
| D667,830 S | 9/2012 | Seoc et al. | |
| D670,292 S | 11/2012 | Komatani et al. | |
| D688,668 S | 8/2013 | Ben-Gad et al. | |
| 8,561,295 B2 * | 10/2013 | Hubert | G06K 19/07741 29/832 |
| 8,637,978 B2 | 1/2014 | Takiar et al. | |
| D700,183 S * | 2/2014 | Ridyard | D14/436 |
| D704,192 S | 5/2014 | Ridyard | |
| D726,189 S * | 4/2015 | Shu | D14/436 |
| 2004/0089717 A1 * | 5/2004 | Harari | G06F 13/387 235/441 |
| 2004/0235353 A1 * | 11/2004 | Katsumata | G06K 19/077 439/630 |
| 2005/0014298 A1 * | 1/2005 | Takiar | G06K 19/077 438/14 |
| 2005/0021909 A1 | 1/2005 | Much et al. | |
| 2005/0185371 A1 | 8/2005 | Kuroda et al. | |
| 2005/0192686 A1 | 9/2005 | Hirota et al. | |
| 2005/0279838 A1 | 12/2005 | Wang et al. | |
| 2007/0099340 A1 | 5/2007 | Takiar et al. | |
| 2007/0126099 A1 | 6/2007 | Aoki et al. | |
| 2007/0190836 A1 * | 8/2007 | Tanaka | G06K 7/0021 439/159 |
| 2007/0228536 A1 | 10/2007 | Aoki | |
| 2007/0263365 A1 | 11/2007 | Yamada et al. | |
| 2008/0030963 A1 | 2/2008 | Middlekauff et al. | |
| 2008/0065830 A1 * | 3/2008 | Aoki | G06K 19/07732 711/115 |
| 2008/0225498 A1 | 9/2008 | Osako et al. | |
| 2011/0090277 A1 | 4/2011 | Pomerantz et al. | |
| 2011/0092087 A1 * | 4/2011 | Jung | H01R 27/02 439/159 |
| 2011/0134620 A1 * | 6/2011 | Kang | G06K 19/07732 361/783 |
| 2012/0117315 A1 | 5/2012 | Okada | |
| 2013/0258576 A1 * | 10/2013 | Ben-Gad | G06K 13/0806 361/679.32 |
| 2013/0260612 A1 * | 10/2013 | Sherry | G06K 7/0021 439/630 |
| 2014/0106621 A1 * | 4/2014 | Wu | G06K 19/063 439/630 |
| 2014/0127947 A1 | 5/2014 | Han | |

OTHER PUBLICATIONS

Written Opinion mailed on Aug. 25, 2014, issued in connection with International Application No. PCT/US2014/032981 (4 pages).

Project "Gameboy Advance Cartridge Battery Replacement," dated Feb. 9, 2011, printed from the Internet, http://projectrepair.blogspot.com/2011/02/project-gameboy=advance-cartridge.html (5 pages).

Chapter 3 entitled "Card Physical," from CF+and CompactFlash Specification Revison 3.0, dated Dec. 23, 2004, CompactFlash Association (21 pages).

Micro SD Card Product Specification Version 1.0, dated Oct. 24, 2005, TwinMOS Technology, Inc. (13 pages).

Pages from Toshiba SD Card Specification, dated Feb. 10, 2003, Toshiba Corporation (3 pages).

Notice of Allowance dated Mar. 11, 2015, from pending U.S. Appl. No. 29/487,073 (14 pages).

* cited by examiner

REDUCED LENGTH MEMORY CARD

CROSS-REFERENCE TO RELATED APPLICATION

This application claims priority to U.S. Provisional Patent Application No. 61/809,033 filed on Apr. 5, 2013, which is incorporated herein by reference in its entirety and made a part hereof.

FIELD OF THE INVENTION

The present invention relates to memory cards for digital devices. More specifically, the present invention relates to a reduced length memory card.

RELATED ART

Memory cards of various sizes and formats, such as memory cards conforming to the industry-standard Secure Digital (SD) format, are often used to store digital content of various types. SD cards have been in use over a decade, and offer a compact and removable storage medium useful in a variety of applications.

Memory cards are often used in connection with devices of various types, such as laptop computers, "netbooks," "ultrabooks," tablet computers, desktop computers, smart phones, cellular phones, media players, and other types of devices. A particular problem with existing memory cards, and with SD cards in particular, is the fact that such cards often protrude from devices in which the cards are being used. For example, when SD cards are used with some "ultrabook" computers, the SD card protrudes from the computer when it is installed for use in a memory card slot of the computer. Not only is this visually obtrusive, but it also increases the likelihood of damage to the card and/or possible inadvertent removal of the card from the slot when the card is in use, thereby also increasing the likelihood of loss and/or corruption of data on the card.

SUMMARY

The present invention relates to a reduced length memory card for use with various digital devices such as "netbooks," "ultrabooks," and other types of computing devices. The card is electrically compatible with many existing SD cards, and has a reduced length resulting in decreased protrusion of the card when inserted into a card slot of a computer system, card reader, etc. The length of the card is preferably equal to or less than the width of the card, thereby resulting in a reduced profile. An extraction ridge is provided on one end of the card to facilitate removal of the card from a host device and to prevent the card from becoming lodged inside of a non-compatible host device.

BRIEF DESCRIPTION OF THE DRAWINGS

The foregoing features of the invention will be apparent from the following Detailed Description of the Invention, taken in connection with the following drawings, in which.

DETAILED DESCRIPTION OF THE INVENTION

The present invention relates to a reduced length memory card, as discussed in detail below in connection with FIGS. 1-8.

Figure 1:
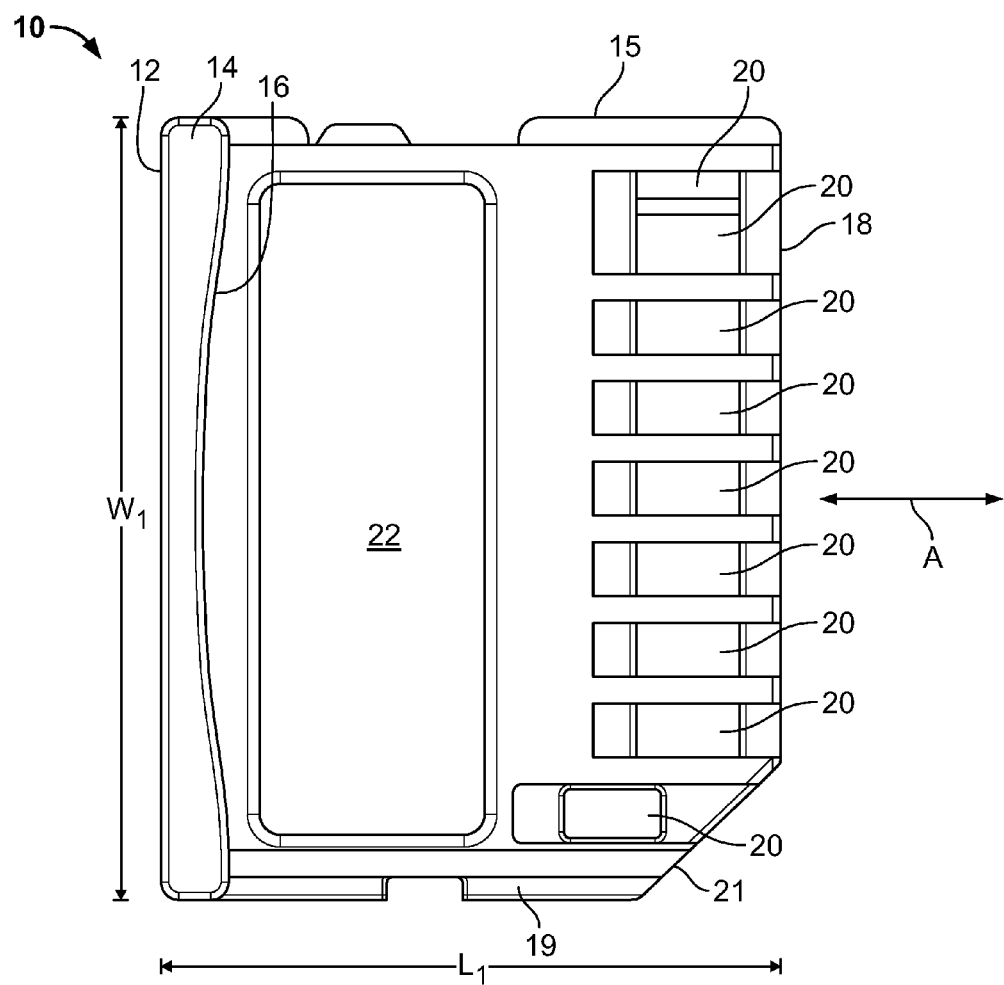
FIG. 1 is a bottom view of the reduced length memory card of the present invention.

FIG. 1 is a bottom view of the reduced length memory card of the present invention, indicated generally at 10. In this embodiment, the card 10 includes a housing having a reduced length, e.g., a length $L_1$ which is less than a width $W_1$ of the card. The housing of the card 10 includes a first end 12 and an extraction ridge 14 positioned on the lower surface of the card along the first end 12. The extraction ridge 14 could include a curved wall 16 to facilitate gripping of the card by a user's finger, so that the card 10 is easy to grip and remove from a slot of a host device in which the card 10 is inserted. Additionally, the extraction ridge 14 prevents the card 10 from being lodged inside of a non-compatible device. A second end 18, opposite the first end 12, is inserted into a slot of the host device, in the general direction indicated by arrow A. As will be discussed in greater detail below, the housing of the card 10 is formed from upper and lower housing portions (e.g., halves) which are joined together and which house an electronic memory circuit.

The card 10 conforms to the SD card industry standard electrically, and also mechanically in most respects, such as the mechanical arrangement of the second end 18 (i.e., the connector end). In this regard, the card 10 includes a plurality of electrical contacts 20 and an angled wall 21 (e.g., beveled wall) as is provided in existing SD cards. The contacts 20 are in electrical communication with a memory circuit 30 (see FIG. 3). This permits usage of the card 10 with existing SD card slots, readers, etc., of various computing devices such as netbooks, ultrabooks, etc. Opposing sidewalls 15 and 19 interconnect the first wall 12 (e.g., first end) with the second wall 18 (e.g., second end), and the first wall 12 with the beveled wall 21, respectively. An optional label 22 could be provided on the card 10 (e.g., an upper surface thereof) for allowing indicia to be included on the card.

Figure 2:
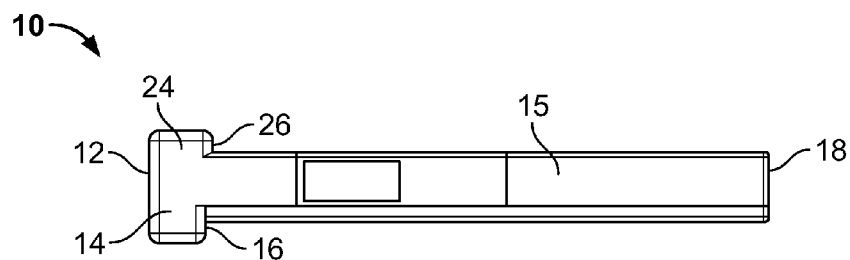
FIG. 2 is a side view of the card shown in FIG. 1.

FIG. 2 is a side view of the card 10 shown in FIG. 1. As can be seen, the ridge 14 is provided on the lower surface of the card 10, along the first edge 12. Optionally, a second ridge 24 could be provided on an upper surface of the card 10, along the first edge 12, to further facilitate extraction of the card 10 and to further prevent the card 10 from being lodged in a non-compatible slot. The second ridge 24 could include a curved wall 26 similar or identical in construction to the curved wall 16 of the first ridge 14.

Figure 3:
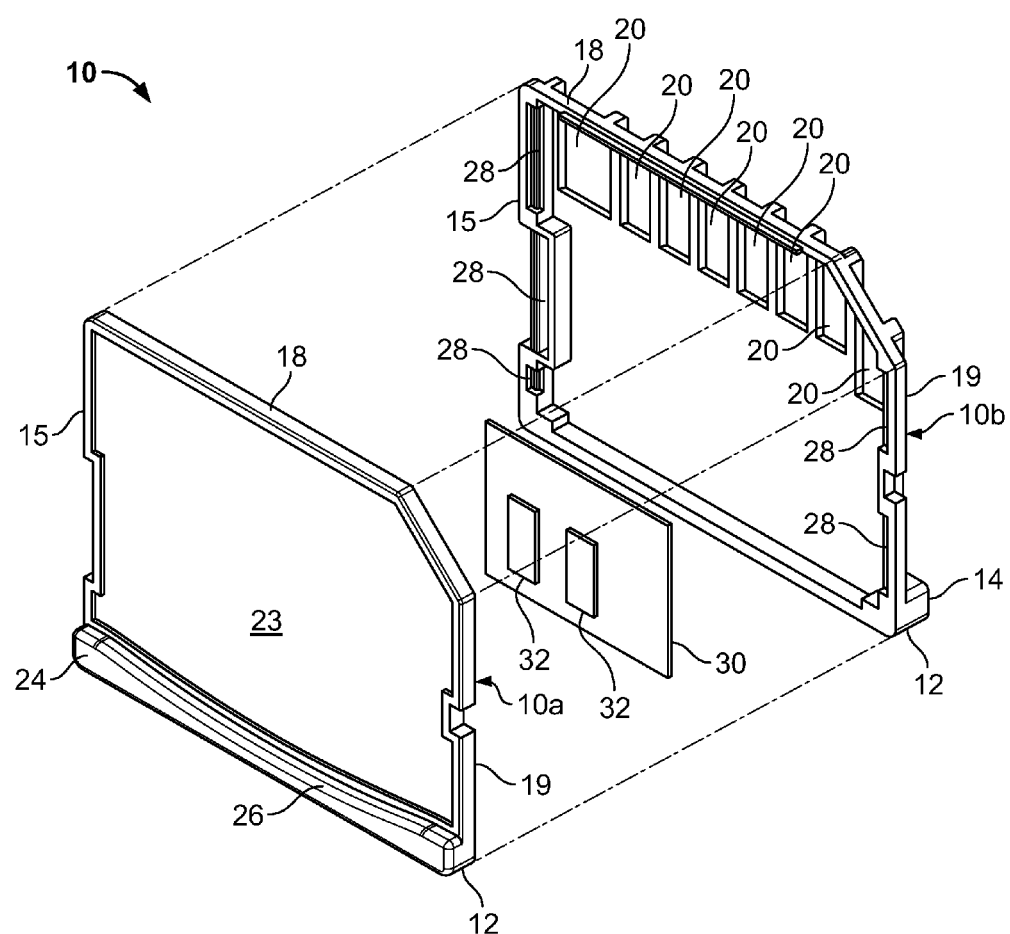
FIG. 3 is an exploded perspective view of the card shown in FIG. 1.

FIG. 3 is an exploded perspective view of the card 10 shown in FIG. 1. The card 10 comprises a top half 10a and a bottom half 10b, and includes all of the features discussed above with respect to FIGS. 1 and 2. The interior surface of the bottom half 10b comprises a plurality of recesses 28, which receive corresponding protrusions (not shown) on the interior surface of the top half 10a. In this way, the top half 10a can be connected to the bottom half 10b by ultrasonic welding, snap fit, interference fit, etc. Also, adhesives and other types of engagements could be used to affix the top half 10a to the bottom half 10b. Further, a label area 23 could be provided on the exterior surface of the top half 10a of the card 10 for allowing a label to be affixed thereto. The top half 10a and the bottom half 10b house the memory circuit 30, which is in electrical communication with the contacts 20. The contacts 20 are exposed through apertures formed in the bottom surface (e.g., bottom half 10b) of the housing.

Figure 6:
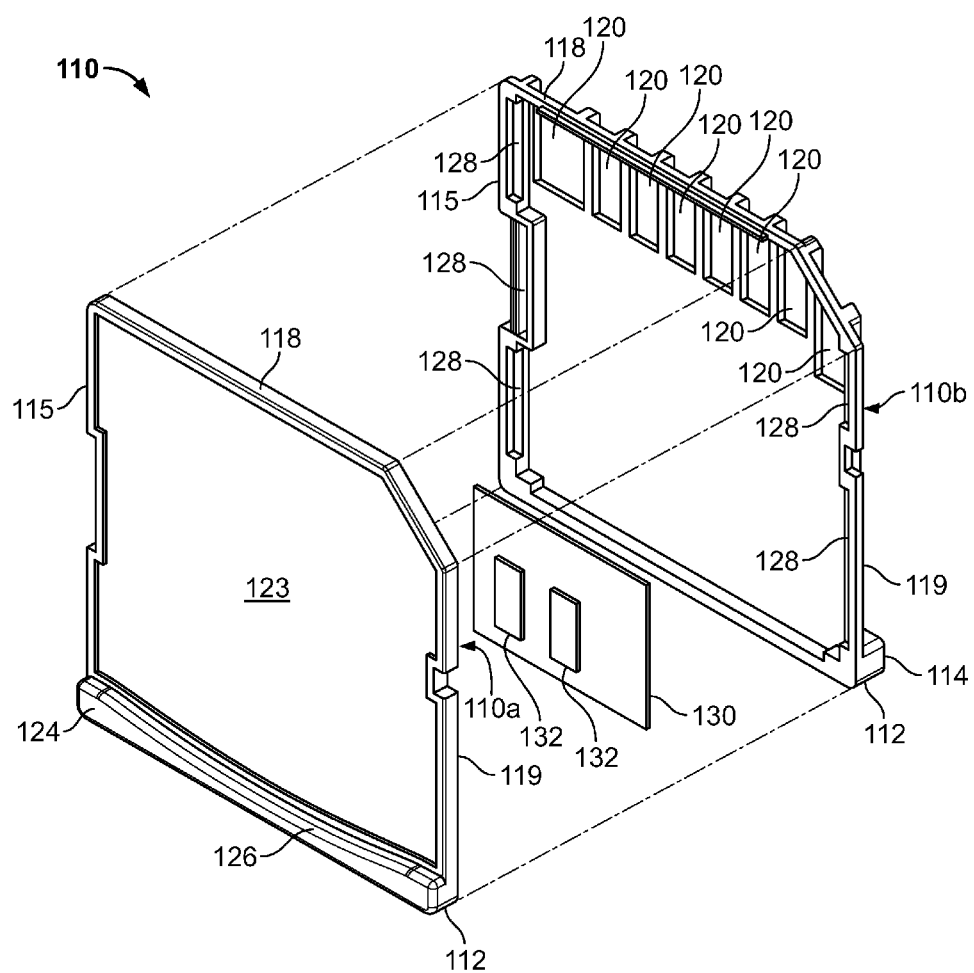
FIG. 6 is an exploded perspective view of the card shown in FIG. 3.

As will be appreciated by one of ordinary skill in the art, the memory circuit 30 (element 130 in FIG. 6) could include one or more memory integrated circuits 32 (element 132 in FIG. 6 (including, but not limited to, flash memory chip(s) and, optionally, an associated controller chip), as well as interconnecting circuit traces and/or supporting discrete components (e.g., resistors, capacitors). Further, the memory circuit 30 could be provided on a printed circuit board, or fashioned as a chip-on-board (COB) assembly.

Figure 4:
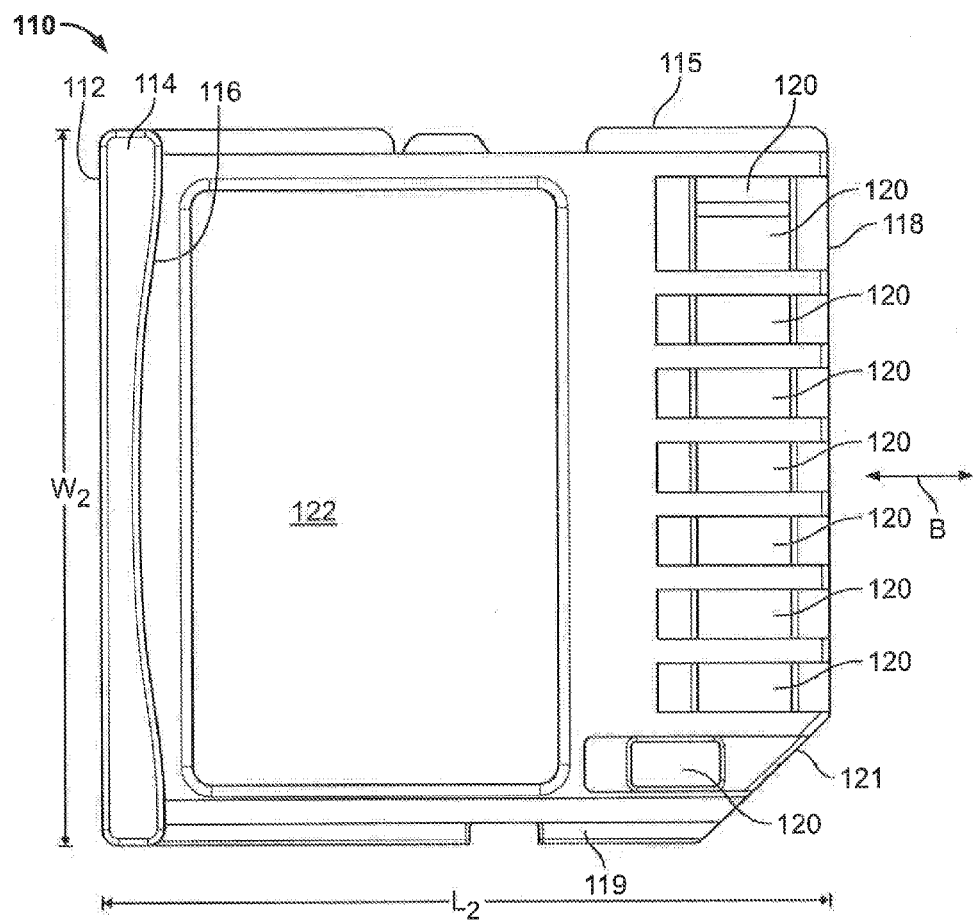
FIG. 4 is a bottom view of another embodiment of a reduced length memory card of the present invention.

FIG. 4 is a bottom view of another embodiment of a reduced length memory card of the present invention, indicated generally at 110. In this embodiment, the card 110 is slightly longer than the card 10, but still includes a reduced length in comparison to existing SD memory cards. In this embodiment, the card 110 has a length $L_2$ which is equal to the width $W_2$ of the card. The card 110 includes a first end 112 and an extraction ridge 114 positioned on the lower surface of the card along the first end 112. The extraction ridge 114 could include a curved wall 116 to facilitate gripping of the card by a user's finger, so that the card 110 is easy to grip and remove from a slot of a host device in which the card 110 is inserted. Additionally, the extraction ridge 114 prevents the card 110 from being lodged inside of a non-compatible device. A second end 118, opposite the first end 112, is inserted into a slot of the host device, in the general direction indicated by arrow B.

The card 110 conforms to the SD card industry standard electrically, and also mechanically in most respects, such as the mechanical arrangement of the second end 118 (i.e., the connector end). In this regard, the card 110 includes a plurality of electrical contacts 120 and an angled wall 121 as is provided in existing SD cards. This permits usage of the card 110 with many existing SD card slots, readers, etc., of various computing devices such as netbooks, ultrabooks, etc. Opposing sidewalls 115 and 119 interconnect the first wall 112 with the second wall 118, and the first wall 112 with the beveled wall 121, respectively. An optional label 122 could be provided on the card 110 for allowing indicia to be included on the card.

Figure 5:
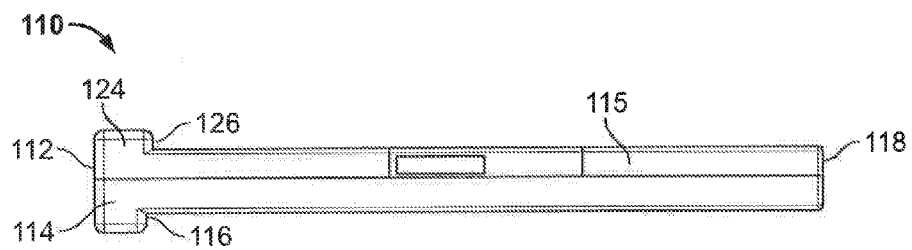
FIG. 5 is a side view of the card shown in FIG. 3.

FIG. 5 is a side view of the card 110 shown in FIG. 3. As can be seen, the extraction ridge 114 is provided on the lower surface of the card 110, along the first edge 112. Optionally, a second extraction ridge 124 could be provided on an upper surface of the card 110, along the first edge 112, to further facilitate extraction of the card 110 and to further prevent the card 110 from being lodged in a non-compatible slot. The second extraction ridge 124 could include a curved wall 126 similar or identical in construction to the curved wall 116 of the first extraction ridge 114.

FIG. 6 is an exploded perspective view of the card 110 shown in FIG. 1. The card 110 comprises a top half 110a and a bottom half 110b, and includes all of the features discussed above with respect to FIGS. 4 and 5. The interior surface of the bottom half 110b comprises a plurality of recesses 128, which receive corresponding protrusions (not shown) on the interior surface of the top half 110a. In this way, the top half 110a can be connected to the bottom half 110b by ultrasonic welding, snap fit, interference fit, etc. Also, adhesives and other types of engagements could be used to affix the top half 110a to the bottom half 110b. Further, a label area 123 could be provided on the exterior surface of the top half 110a of the card 110 for allowing a label to be affixed thereto.

Figure 7:
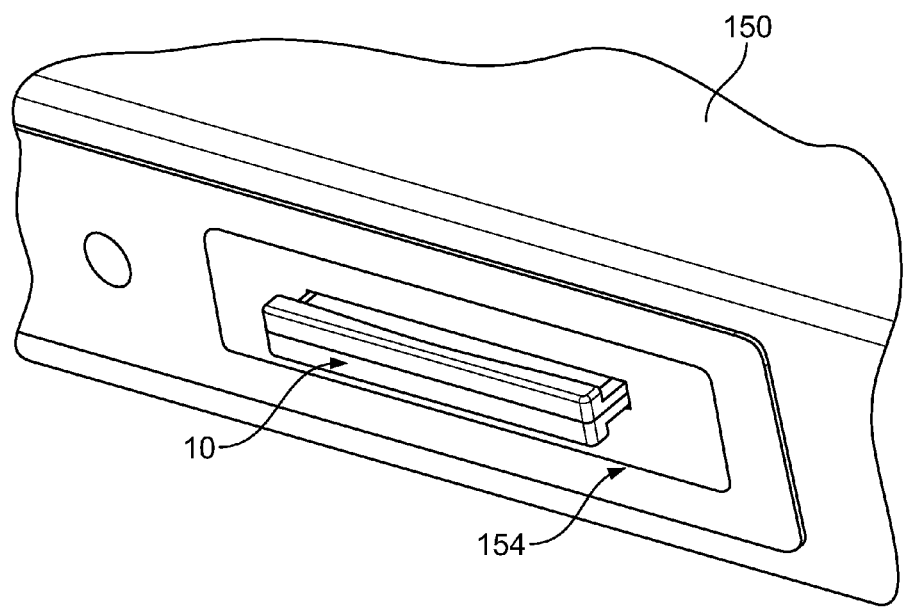
FIG. 7 is a perspective view of the reduced length memory card inserted into a host device.

FIG. 7 is a perspective view of the reduced length memory card 10 inserted into a host device 150. The card 10 is shown inserted into a memory card slot 10 of the host device 150, such as an existing SD card slot of the host device 150.

Figure 8:
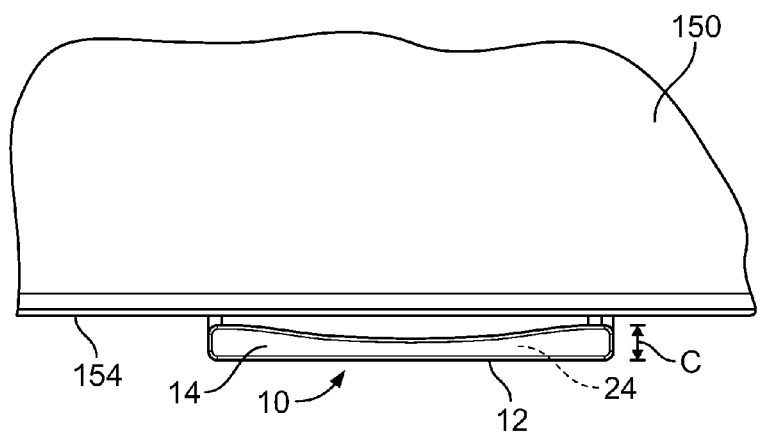
FIG. 8 is a top view of the reduced length memory card shown in FIG. 7.

As can be appreciated with reference to FIG. 8, the first end 12 of the card 10 only protrudes from a side wall 154 of the host device 150 a reduced distance C, thereby resulting in an unobtrusive visual appearance and reducing the possibility of inadvertent removal and/or jostling of the card 10 during use. The extraction ridges 14 and 24 can be conveniently gripped by a user's fingers to extract the card 10 from the host device 150. Of course, although both extraction ridges 14 and 24 could be provided, only a single extraction ridge need be provided (or no extraction ridge need be provided).

Having thus described the invention in detail, it is to be understood that the foregoing description is not intended to limit the spirit or scope thereof. It will be understood that the embodiments of the present invention described herein are merely exemplary and that a person skilled in the art may make many variations and modification without departing from the spirit and scope of the invention. All such variations and modifications, including those discussed above, are intended to be included within the scope of the invention. What is desired to be protected is set forth in the following claims.

What is claimed is:

1. A memory card, comprising:
   a memory circuit;
   a housing for said memory circuit, said housing defining a first end, a second end opposite the first end and insertable into a port of a digital device, and opposing sidewalls between the first end and the second end, a first concave extraction ridge on an upper surface of the housing at the first end and extending along a width of the card between the opposing sidewalls, and a second concave extraction ridge on a lower surface of the housing at the first end and extending along the width of the card between the opposing sidewalls, said first and second concave extraction ridges each curving inwardly toward the first end; and
   a plurality of electrical contacts in electrical communication with said memory circuit, said contacts exposed at the second end through apertures formed in the lower surface of the housing,
   wherein the memory card is electrically compatible with a Secure Digital (SD) standard, and wherein a length of the card extending between the first end and the second end is less than the width of the card extending between the opposing sidewalls.

2. The memory card of claim 1, wherein the first and second concave extraction ridges are exposed when the card is inserted into the port of the digital device.

3. The memory card of claim 1, wherein the first and second concave extraction ridges include a curved wall to facilitate gripping of the card.

4. The memory card of claim 1, further comprising a label attached to the upper surface of the card.

5. The memory card of claim 1, wherein the first end of the card extends a reduced distance from a sidewall of a host device when the card is inserted into the host device to reduce inadvertent removal and/or jostling of the card.

6. A memory card, comprising:
a memory circuit;
a housing for said memory circuit, said housing defining a first end, a second end opposite the first end and insertable into a port of a digital device, opposing sidewalls between the first end and the second end, a first concave extraction ridge on an upper surface of the housing along the first end of the card extending between the opposing sidewalls, a second concave extraction ridge on a lower surface of the housing along the first end of the card extending between the opposing sidewalls, the first and second concave extraction ridges each curving inwardly toward the first end, the first and second extraction ridges exposed when the card is inserted into the port of the digital device; and
a plurality of electrical contacts in electrical communication with said memory circuit, said contacts exposed through apertures formed in the lower surface of the housing extending between the first end and the second end,
wherein a length of the card extending between the first end and the second end is less than a width of the card extending between the opposing sidewalls.

7. The memory card of claim 6, wherein the memory card is electrically compatible with a Secure Digital (SD) standard.

8. The memory card of claim 6, wherein the first and second concave extraction ridges include a curved wall to facilitate gripping of the card.

9. The memory card of claim 6, further comprising a label attached to the upper surface of the card.

10. The memory card of claim 6, wherein the first end of the card extends a reduced distance from a sidewall of a host device when the card is inserted into the host device to reduce inadvertent removal and/or jostling of the card.

* * * * *